United States Patent [19]
Matsuda et al.

[11] Patent Number: 5,347,158
[45] Date of Patent: Sep. 13, 1994

[54] SEMICONDUCTOR DEVICE HAVING A PARTICULAR TERMINAL ARRANGEMENT

[75] Inventors: Tadashi Matsuda, Kawasaki; Tetsujiro Tsunoda, Fujisawa, both of Japan

[73] Assignee: Kabushiki Kaisha Toshiba, Kawasaki, Japan

[21] Appl. No.: 107,616

[22] Filed: Aug. 18, 1993

[30] Foreign Application Priority Data

Aug. 19, 1992 [JP] Japan ................... 4-220106

[51] Int. Cl.⁵ ............... H01L 23/16; H01L 39/02; H01L 23/02
[52] U.S. Cl. ................... 257/691; 257/724; 257/706
[58] Field of Search ............ 257/723, 724, 691, 735, 257/787, 694, 695, 706; 361/792, 794, 704, 707

[56] References Cited

U.S. PATENT DOCUMENTS

| 4,042,952 | 8/1977 | Kraybill . | |
|---|---|---|---|
| 4,639,759 | 1/1987 | Neidig et al. | 257/724 |
| 4,649,416 | 3/1987 | Borkowski et al. . | |
| 4,907,068 | 3/1990 | Amann et al. | 257/724 |
| 4,920,405 | 4/1990 | Itoh et al. | 257/724 |
| 5,172,215 | 12/1992 | Kobayashi et al. | 257/724 |
| 5,291,065 | 3/1994 | Arai et al. | 257/691 |

FOREIGN PATENT DOCUMENTS

| 277546 | 8/1988 | European Pat. Off. . | |
|---|---|---|---|
| 0372228 | 6/1990 | European Pat. Off. . | |
| 0427143 | 5/1991 | European Pat. Off. . | |
| 61-64144 | 4/1986 | Japan | 257/698 |
| 61-191056 | 8/1986 | Japan | 257/698 |

OTHER PUBLICATIONS

Harold Vetter. High-Performance Capacitors for Low-Inductance Circuits Power Conversion, Jun. 1991 Proceedings. pp. 141-148.

*Primary Examiner*—Rolf Hille
*Assistant Examiner*—S. V. Clark
*Attorney, Agent, or Firm*—Oblon, Spivak, McClelland, Maier & Neustadt

[57] ABSTRACT

A semiconductor device for accomplishing high speed switchings with a large current includes a radiation plate, a first conductor fixed on said radiation plate, a first insulating layer fixed on said first conductor, a second conductor fixed on said first insulating layer, at least one semiconductor element and a second insulating layer fixed on said second conductor, a third conductor fixed on said second insulating layer, a fourth conductor for electrically connecting the surface electrode of said semiconductor element with said third conductor, a first power terminal fixed on said second conductor, and a second power terminal fixed on said third conductor. To reduce the internal inductance, said first and second power terminals have a flat part whose width is larger in length than the height. Also, these terminals are adjacently arranged substantially parallel to each other. In this device, the main currents on said first and second power terminals, and on said second and fourth conductors flow in the opposite directions, thus further reducing the internal inductance.

15 Claims, 10 Drawing Sheets

SEMICONDUCTOR DEVICE HAVING A PARTICULAR TERMINAL ARRANGEMENT

BACKGROUND OF THE INVENTION

1. Field of the Invention

This invention relates to a semiconductor device which is able to accomplish high speed switchings with a large current. In particular, this invention relates to a semiconductor device whose internal inductance is greatly reduced so as to reduce its surge voltage.

2. Description of the Prior Art

Generally speaking, a semiconductor device for use with a large current has the basic structure, which is described by means of the equivalent circuit shown in FIG. 10, comprised of two transistors and two diodes. This devices is used in the field of power electronics to accomplish power conversion, power control and so on.

Such a device is mainly applied to a three-phase motor driving circuit. In FIG. 11, the structure of this circuit is shown as an example. As shown in this figure, six control transistors are needed for driving the three-phase motor. Thus, three semiconductor devices having a two circuit structure shown in FIG. 10 are necessary in order to construct the driving circuit.

Besides the circuit shown in FIG. 10, the semiconductor device for use with a large current may have the circuit structure shown in FIG. 12a or 12b. The circuit shown in FIG. 12a has a structure comprised of one circuit and the other shown in FIG. 12b has a structure comprised of two circuits.

The motor control circuit, in which the above mentioned semiconductor device is applied, is usually driven in the PWM (Pulse Width Modulation) control mode. The carrier frequency of this mode has become over 10 KHz through the development of semiconductor devices. As the carrier frequency goes high, the magnitude of a noise generated by a motor becomes small. In order to increase the carrier frequency, the semiconductor device should be switched at a very high speed. In this case, however, a voltage is induced into inductance L in a main circuit according to the abrupt current change arisen in this circuit at every switching. As a result, a surge voltage $-L\,(di/dt)$ is generated. When the magnitude of this surge voltage is extremely large, semiconductor elements contained in the semiconductor device may be destroyed. In addition, this surge voltage becomes a cause of wrong operations and the destruction of external control and protection circuits. Consequently, the surge voltage should be reduced as much as possible.

The magnitude of a surge voltage largely depends on inductance L. In order to reduce the magnitude of this surge voltage, therefore, external wirings should be so arranged that the magnitude of inductance L becomes minimum. Also, as shown in FIGS. 13a and 13b, a snubber circuit, made of a resister, a condenser, at least one diode and others, is provided to reduce the magnitude of inductance L.

In the above mentioned prior art, however, countermeasures only for the external inductance L of the semiconductor device have been taken. In other words, no countermeasure is taken for the reduction of internal inductance L arising on the internal circuit of the semiconductor device.

Thus, the reduction of the magnitude of inductance L arising on the internal circuit is highly desirable in order to lower the surge voltage as far as possible.

As shown in FIG. 10, the internal inductance L of the semiconductor device is composed of the following: inductance $L_{C1}$ at the first power terminal; inductance $L_{C2E1}$ at the second power terminal; inductance $L_{E2}$ at the third power terminal; and inductance LB'g at the bonding wire part.

In general, the self-inductance of a conductor, which is a cylinder having a length l, a radius a, and a permeability $\mu$ as shown in FIG. 14a, is expressed as follows as far as a current flows uniformly through the sectional area of the conductor:

$$L_S = \frac{\mu l}{2\pi}\left(\log \frac{2l}{a} - \frac{3}{4}\right) \quad (1)$$

If there are two cylinders, one of which has a length l and a radius a and the other of which has a length l and a radius b, arranged parallel having distance d as shown in FIG. 14b, mutual inductance M arises as follows, in addition to said self-inductance $L_s$:

$$M = \frac{\mu l}{2\pi}\left(\log \frac{2l}{d} - 1\right) \quad (2)$$

In this case, the mutual inductance M has a positive value when both currents on the respective cylinders flow in the same direction. On the contrary, when each current on the respective cylinders flows in opposite directions, M has a negative value.

Then, the total inductance L of the conductors shown in FIG. 14b is written as follows:

$$L = L_s + M \quad (3)$$

As is evident from the above formulas, the inductance L strongly depends on the length l of the conductors, their sectional areas, distance d between them, and the directions of the currents.

In the prior art semiconductor device, the internal wirings for power terminals are long in length and small in sectional area, and thus, each power terminal has a large self-inductance value $L_s$.

In addition, the lengths and the current directions among said power terminals can't be set so as to reduce the magnitude of mutual inductance M. As a result, the magnitude of mutual inductance M among the power terminals has become a large value in the prior art device. Accordingly, inductance $L_{C1}$, $L_{C2E1}$ or $L_{E2}$ of respective power terminals shown in FIG. 10 has become a large value in each power terminal.

Still in addition, the current directions on an internal bonding wire and on a substrate can't be set in the prior art device so as to reduce the magnitude of mutual inductance M. Therefore, the magnitude of mutual inductance M in the bonding wires remains large in the prior art device.

As explained above, the internal inductance of the prior art device has a relatively large value with respect to the inductance value arising from external wirings. This fact prevents the reduction of the above mentioned surge voltage.

SUMMARY OF THE INVENTION

This invention has been made to overcome the above mentioned problems of the prior art device.

Therefore, the objective of the present invention is to provide a semiconductor device whose internal inductance is controlled to be very small so as to reduce its surge voltage.

Another objective of the present invention is to provide a semiconductor device which is able to accomplish high speed switchings with a large current without being destroyed and without inducing wrong operations and the destruction of external circuits.

The first feature of the present invention is to provide a semiconductor device for switching a large current at a high speed, the device which is comprised of the following: a radiation plate; a first conductor fixed on said radiation plate; a first insulating layer fixed on said first conductor; a second conductor fixed on said first insulating layer; at least one semiconductor element and a second insulating layer fixed on said second conductor; a third conductor fixed on said second insulating layer; a fourth conductor for electrically connecting the surface electrode of said semiconductor element with said third conductor; a first power terminal fixed on said second conductor; and a second power terminal fixed on said third conductor.

The second feature of the present invention is that, in the semiconductor device having said first feature, said first and second power terminals have a flat part whose width is larger than its height, and are adjacently arranged to be substantially parallel to each other.

The third feature of the present invention is that, in the semiconductor device having said first and second features, the device is so constructed that the main current on said first power terminal flows in the opposite direction of the main current on said second terminal, and the main current on said second conductor flows in the opposite direction of the main current on said fourth conductor.

According to said first, second, and third features, the magnitude of self-inductance of each structure part is greatly reduced so that the surge voltage of the whole device is reduced.

As a result, a semiconductor device, which is able to accomplish high speed switchings with a large current (that is, with large di/dt) without being destroyed and without inducing wrong operations and the destruction of external circuits, is provided according to the present invention.

These and other objectives, features, and advantages of the present invention will be more apparent from the following detailed description of preferred embodiment in conjunction with the accompanying drawings.

DETAILED DESCRIPTION OF EMBODIMENTS

Figure 1:
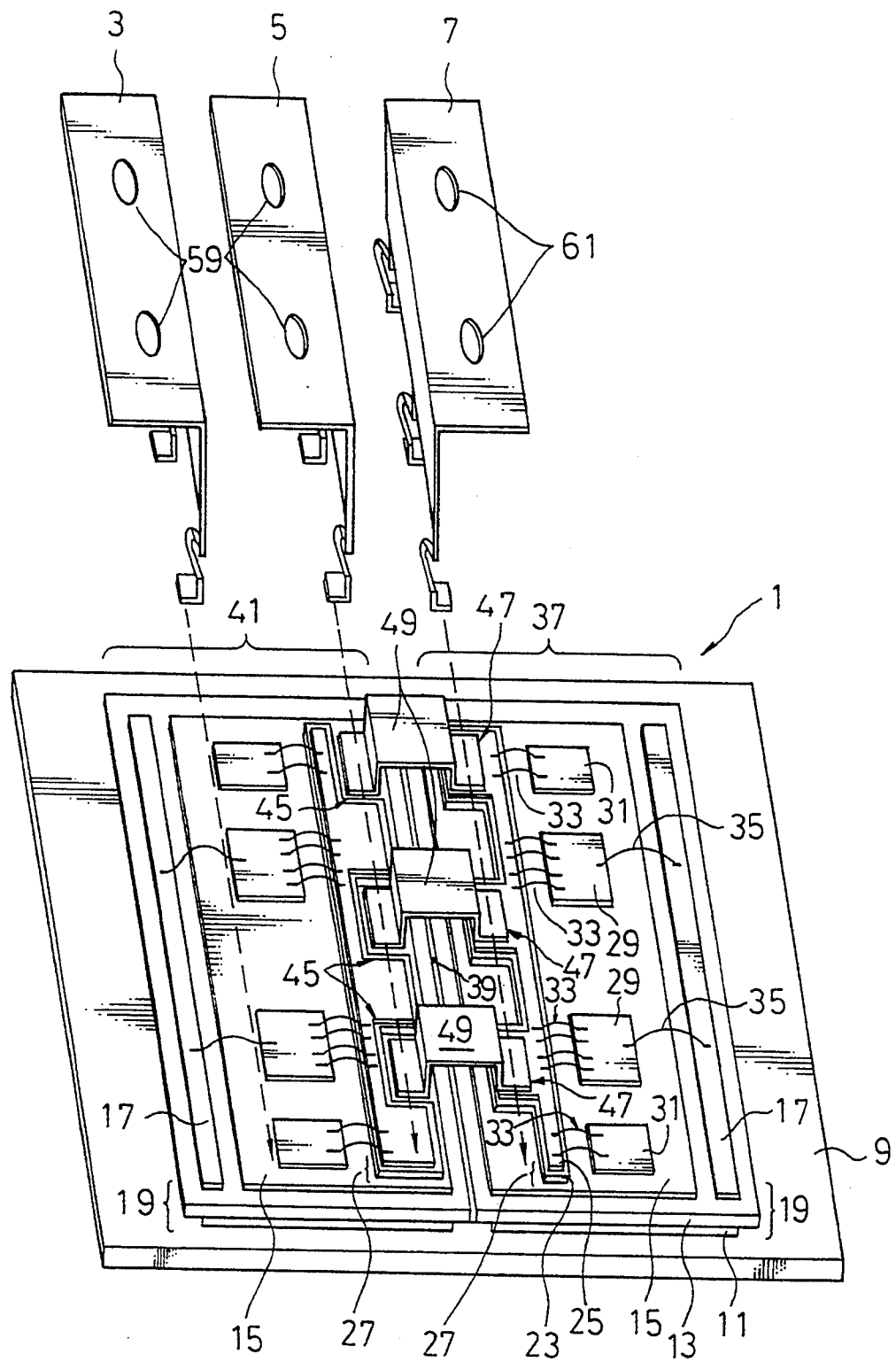
FIG. 1 is an oblique view showing the internal structure of a semiconductor device for use with a large current according to one embodiment of the present invention, especially in the state before power terminals having been connected to predetermined positions of a substrate.
Figure 2:
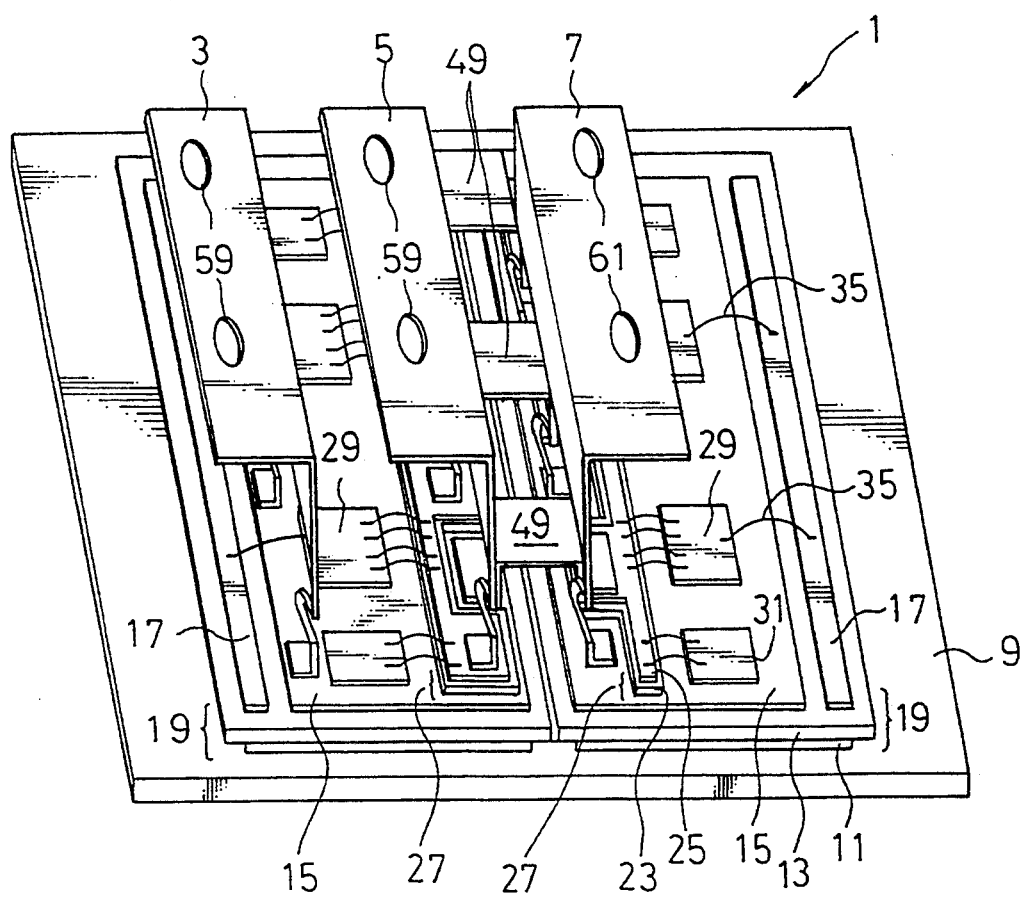
FIG. 2 is an oblique view showing the internal structure of the device according to said first embodiment of the present invention, especially in the state after power terminals having been connected to said predetermined positions.
Figure 3:
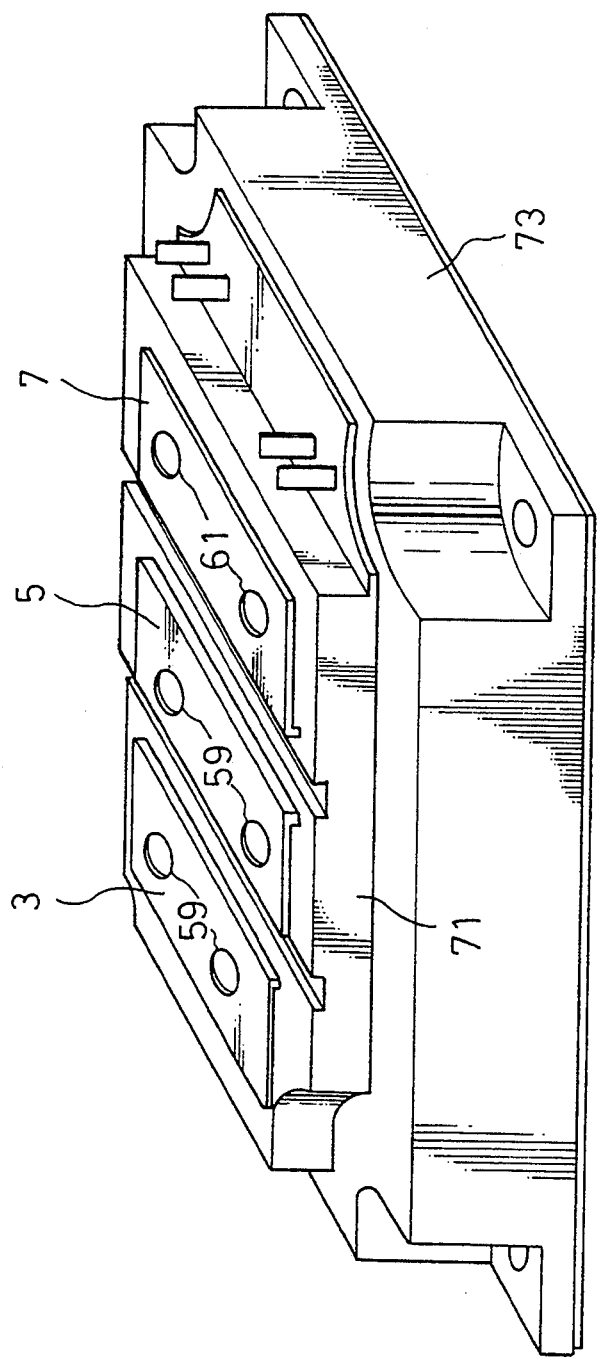
FIG. 3 is an oblique view showing the external appearance of the device shown in FIG. 2, after having been molded by resin.

FIGS. 1 and 2 show the internal structure of a semiconductor device for use with a large current according to one embodiment of the present invention, In particular, FIG. 1 shows the device structure in which power terminals have not been installed yet at certain positions of a substrate, On the other hand, FIG. 2 shows the device structure in which said terminals have already been installed at the certain positions, FIG. 3 is an oblique view showing the appearance of the semiconductor device whose internal structure is shown in FIG. 2, the device having undergone a resin molding process.

As shown in FIGS. 1 and 2, this device is mainly comprised of a substrate 1, on which diodes and transistors are bonded, and power terminals 3, 5, and 7, each of which is installed at a predetermined position of substrate 1. Substrate 1 has a radiation plate 9 which is made from Cu and has a thickness of about 3.5 mm. On the right side of plate 9, a packaging substrate 19 (referred to as first DBC substrate 19, below) is soldered. This substrate 19 is comprised of a first copper layer 11, a first insulating ceramic plate 13 made from $Al_2O_3$, AlN and others, and a third and fourth Cu layers 15 and 17 which are formed on the first ceramic plate 13 with being separated to each other. These layers 11, 15, and 17 and plate 13 are formed on radiation plate 9 by the DBC (Direct Bonding Copper) method. In addition, on third Cu layer 15, a packaging substrate 27, which is comprised of a second insulating ceramic plate 23 made from $Al_2O_3$, AlN, etc. and a sixth Cu layer 25, is formed using the DBC method. This substrate 27 (referred to as second DBC substrate, below) has a plurality of pairs (in this embodiment, three pairs) of a part having a large width and another part having a small width, each of which is arranged in a line alternatively. On other parts of third Cu layer 15, the collector or drain regions (back surface tip electrodes) of transistors 29 and the cathode regions (back surface tip electrodes) of diodes 31 are soldered. The emitter or source regions (front surface tip electrodes) of transistors 29 and the anode regions (front surface tip electrodes) of diodes 31 are connected with sixth Cu layer 25 on second DBC substrate 27 through Al bonding wires 33.

In said structure, third Cu layer 15, which is connected with the back surface tip electrodes of transistors 29 and diodes 31, and sixth Cu layer 25, which is connected with the front surface tip electrodes of transistors 29 and diodes 31, are in the form of a uniform plate having a large width. Thus, the main currents flowing through third Cu layer 15 and sixth Cu layer 25 are uniformly scattered throughout these layers, thus preventing current concentration. As a result, the self-inductance component Ls existing in layers 15 and 25 are reduced in this structure.

Figure 4:
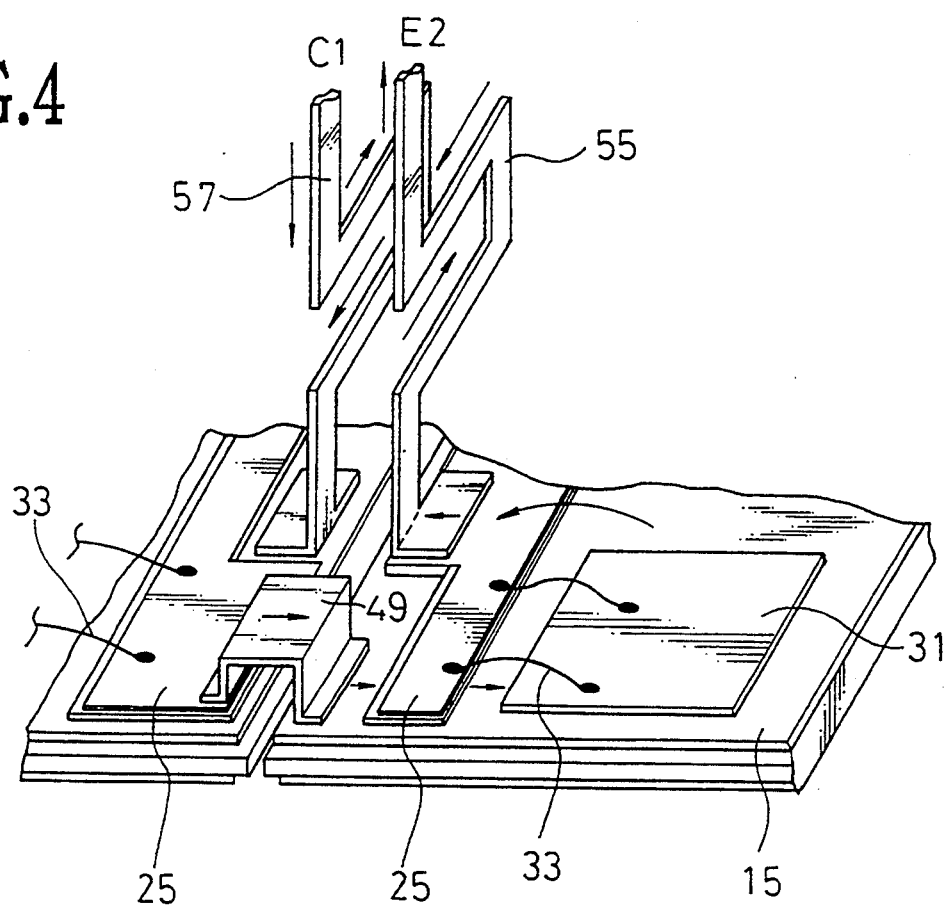
FIG. 4 is an enlarged oblique view showing a part of structure of the device shown in FIG. 2.

In addition, as shown in FIG. 4, third Cu layer 15 and Al bonding wires 33 are adjacently arranged to be substantially parallel to each other. And, the currents on third Cu layer 15 and Al bonding wires 33 flow in opposite directions to each other. As a result, the mutual inductance M in this area has a negative value, thus further reducing the inductance component in this area.

The base or gate areas of transistors 29 are connected with fourth Cu layer 17 on first DBC substrate 19 through Al bonding wires 35. Thus, $C_1$ circuit 37 is formed on the right side of radiation plate 9.

On the left side of radiation plate 9, $C_2$ circuit 41 is formed which is point symmetry against $C_1$ circuit 37 with respect to the central point 39 of radiation plate 9. Because $C_2$ circuit 41 has the same structure as that of $C_1$ circuit 37, the detailed description of this circuit is omitted.

Parts of second DBC substrate 27 in $C_2$ circuit 41 are formed smaller in width than that of the other parts. On the other hand, parts of second DBC substrate 27 in areas adjacent to said first regions 45 are formed larger in width than that of the other parts. Thus, second regions 47 are formed in second DBC substrate 27. Between first regions 45 and second regions 47 facing each other, third Cu layer 15 is connected with sixth Cu layer 25 through jumper plates 49 at a plurality of points, in order to connect $C_1$ circuit 37 with $C_2$ circuit 41. In this embodiment, circuits 37 and 41 are connected at three points as shown in FIG. 1.

Figure 5:
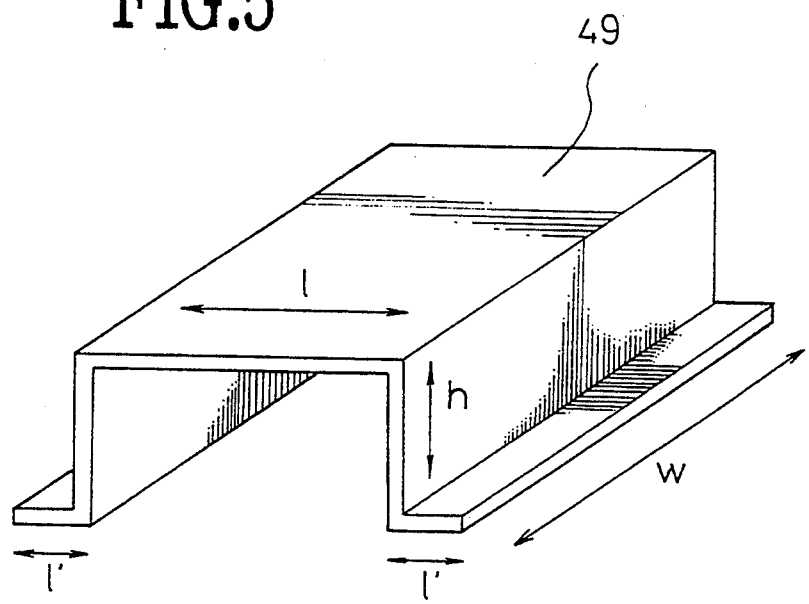
FIG. 5 is an enlarged view for explaining the structure of a jumper plate shown in FIG. 2.

An enlarged view of one Jumper plate 49 is shown in FIG. 5. Plate 49 is made from conductive materials such as Cu. Also, this has a thickness of about 0.5 mm and may be in form of a flat plate. However, it is advisable that plate 49 has the form shown in FIG. 5. In this case, molding resin can easily enter the under parts of jumper plates 49 at a packaging process of this device. If plates 49 are in form of a flat plate, molding resin can't easily enter the under parts of Jumper plates 49, thus generating bubbles in the resin, and so, deteriorating the insulation and the durability against water of the device.

In order to reduce the inductance value of jumper plate 49, its length l and the height h should be as small as possible. On the contrary, its width w should be as large as possible. Due to this arrangement, the main current flowing from $C_1$ circuit 37 to $C_2$ circuit 41 (and vice versa) is uniformly scattered, thus preventing current concentration and reducing the magnitude of inductance.

However, if the length l and height h are too small and the width w is too large, molding resin can't easily enter the under parts of plates 49. Therefore, these values should be optimized. In this embodiment, l is 6 mm, h is 3 mm, and w is 5 mm.

Figure 6:
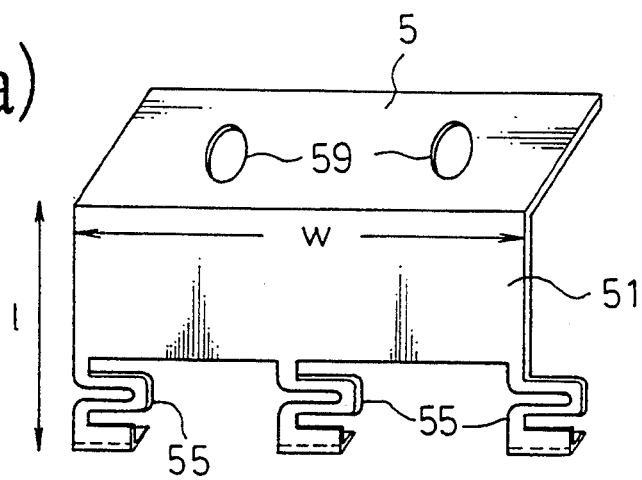
FIGS. 6a and 6b are views for explaining the structures of power terminals shown in FIG. 2.
Figure 6:
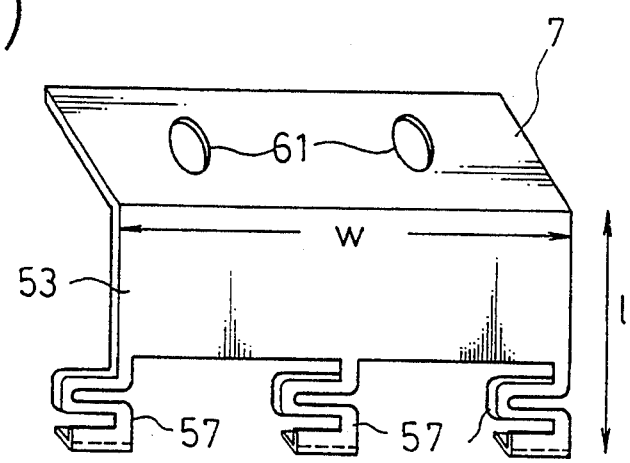

FIG. 6a shows the structures of $C_2E_1$ power terminal 3 and $E_2$ power terminal 5. Because these two terminals have the same structure, only the structure members of $E_2$ power terminal 5 are shown in FIG. 6a. FIG. 6b shows the structure of $C_1$ power terminal 7.

Power terminal 5 (or 7) is comprised of flat part 51 (or 53), a plurality (in this embodiment, three) of bumpers 55 (or 57), and a plurality (in this embodiment, two) of screw holes 59 (or 61).

Bumpers 55 (or 57) are provided in order to absorb the vertical stress which is applied to power terminals 3 and 5 (or 7) at a resin molding process. Also, these bumpers soften the stress which arises due to the temperature change during the use of this semiconductor device.

The self-inductance $L_{C1S}$, $L_{E2S}$, and $L_{C2E1S}$ of power terminals 3, 5, and 7 having the structures shown in FIGS. 6a and 6b are reducible in magnitude because of the reasons described below.

The first reason is that terminals 3, 5, and 7 form the shortest wirings which are extended from $C_1$ circuit 37 and $C_2$ circuit 41 vertically. The second reason is that respective terminals 3, 5, and 7 are comprised of flat part 51 (or 53), in which its width w is larger in magnitude than the height l, a plurality of bumpers 55 (or 57), and a plurality of screw holes 59 (or 61). Due to this structure, the main current, which flows through bumpers 55 (or 57) from $C_1$ circuit 37 or $C_2$ circuit 41 to an external circuit connected through screw holes 59 (or 61), or which flows in the reverse direction, is scattered uniformly throughout said terminals, thus preventing current concentration and decreasing the magnitude of self-inductance.

As shown in FIGS. 6a and 6b, bumpers 55 (or 57) on both sides of power terminal 5 (or 7) are desirable to be placed at both end of flat part 51 (or 53). Also, flat part 51 (or 53) is desirable to have almost the same width w as that of third Cu layer 15 on said $C_1$ circuit 37 (or $C_2$ circuit 41). Further, bumpers 55 (or 57) and screw holes 59 (or 61) may be provided as many as possible.

If only a small number of bumpers 55 (or 57) and screw holes 59 (or 60) are provided, and if the width w of flat part 51 (or 53) is small, the main current will be concentrated within particular areas, thus preventing the reduction of self-inductance.

Bumpers 55 of $C_2E_1$ power terminal 3 are soldered to third Cu layer 15 in first DBC substrate 19 which is included in $C_2$ circuit 41, Bumpers 55 of $E_2$ power terminal 5 are soldered to sixth Cu layer 25 on the wider parts of second DBC substrate 27 which is included in $C_2$ circuit 41. In addition, bumpers 57 of $C_1$ power terminal 7 are soldered to exposed portions of third Cu layer 15 on first DBC substrate 19 contained in $C_1$ circuit 37. Said exposed portions of third Cu layer 15 are formed because the width of second DBC substrate 27 is reduced in these areas.

Figure 7:
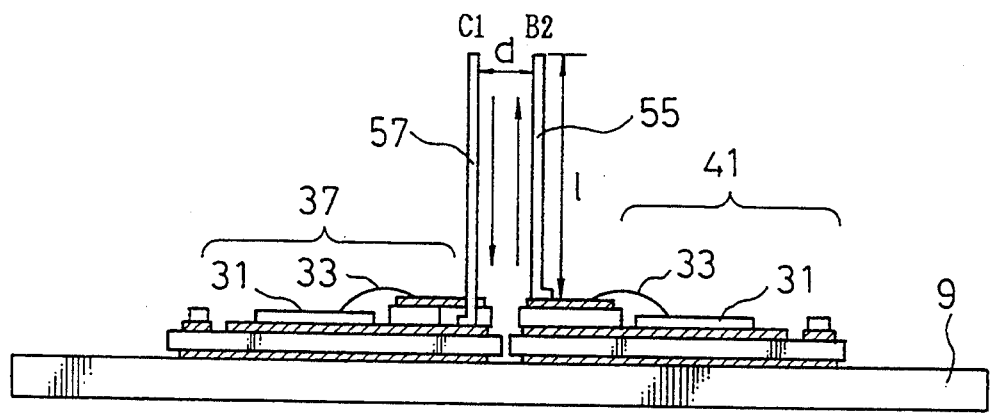
FIG. 7 is an enlarged side view for explaining the outline structure of the device shown in FIG. 2.

On substrate 1, flat part 51 of power terminal 5 is substantially arranged in parallel with flat part 53 of power terminal 7. As well, bumpers 55 are substantially arranged in parallel with bumpers 57. The width d between bumpers 55 and 57 is less than 1/5 of the width w of either one of terminal 5 or 7, whose width is smaller than that of the other. As is evident from FIGS. 4 and 7, the flowing directions of the main current on terminals 5 and 7 are opposite to each other. As a result, mutual inductance $M_{E2C1}$ having a negative value arises on terminals 5 and 7, thus reducing inductance $L_{E2}$ of terminal 5 and inductance $L_{C1}$ of terminal 7.

Figure 8:
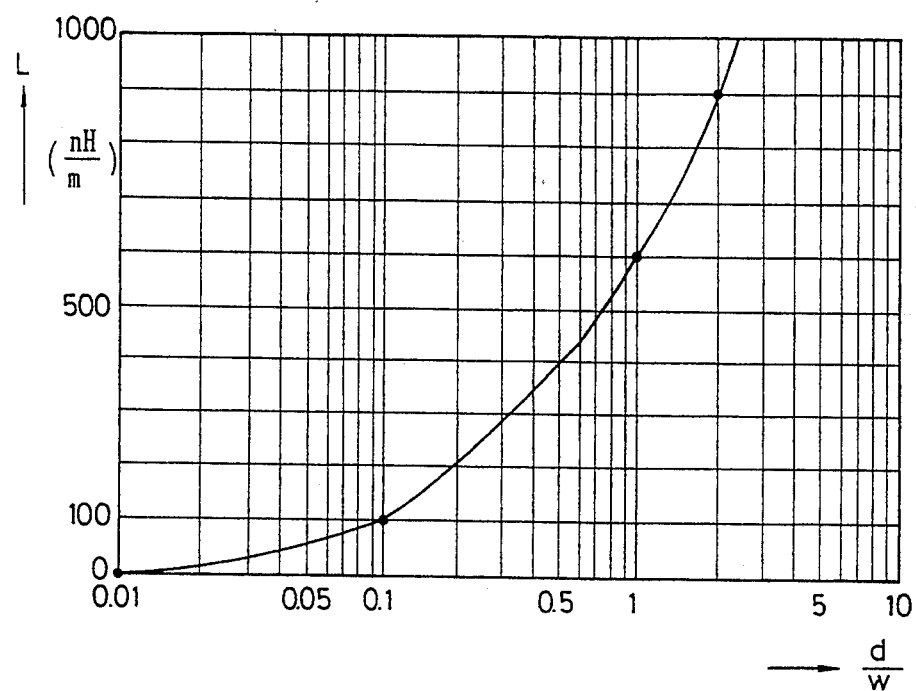
FIG. 8 is a graph showing the relation between the ratio d/w (w: the width of a power terminal, d: the distance between power terminals) and the magnitude of inductance per unit length of a power terminal.

In usual, the magnitude of mutual inductance varies according to the values of terminal width w and distance d between $C_1$ terminal and $E_2$ terminal. Therefore, the magnitude of inductance of respective terminals varies according to the values of width w and distance d. FIG. 8 shows the relation between the magnitude of inductance per unit length of a terminal and the ratio d/w. As is evident from this figure, the magnitude of inductance per unit length increases exponentially according to the increase of ratio d/w. In particular, the magnitude of inductance increases rapidly when ratio d/w exceeds 0.2. Consequently, ratio d/w should be less than 0.2, that is, d <w/5.

A terminal holder 71 made from resin is prepared in advance as shown in FIG. 8. Power terminals 8, 5, and 7 are fixed with this holder, and then, resin case 73 is installed and molded by resin onto radiation plate 9. As a result, a semiconductor device is formed with having the appearance shown in FIG. 8.

In a semiconductor device having the above explained structure, the length of each power terminal can easily be minimized because power terminals 3 and 5 are vertically installed against respective circuits 37 and 41. In addition, each terminal 3, 5, or 7 has a flat part, whose width is wider than its length 1, a plurality of bumpers 55, 55, or 57, and a plurality of screw holes 59, 59, and 61. Further, the width of third and sixth Cu layers connected with semiconductor elements (transistors, diodes, etc.) are relatively large. As a result, the main current flowing through these terminals are uniformly scattered, thus reducing the magnitude of self-inductance at each terminal.

In addition, terminals 5 and 7 are adjacently arranged substantially parallel to each other. And, the current flows through these terminals 5 and 7 in opposite directions. As a result, the mutual inductance between terminals 5 and 7 is reduced.

Still in addition, the packaging substrate having a two layer structure (of first DBC substrate 19 and second DBC substrate 27) is used in this embodiment. Therefore, as shown in FIG. 4, the current flows in the opposite directions between bonding wires 33 and third Cu layer 15, thus also reducing the magnitude of mutual inductance arising between them. So, the total magnitude of internal inductance is highly reduced in this semiconductor device.

Although this embodiment has been described with referring to the semiconductor device having tow circuits, this invention may be applied to semiconductor devices having one circuit, four circuits, and six circuits. The Cu patterns on DBC substrates, the structure of bumpers, and the numbers of bumpers and screw holes, illustrated in the above mentioned embodiment, should not be taken in a limited sense. The substrate may be fabricated using methods other than the DBC method. In addition, as shown in FIG. 15, fifth Cu layer 21 may be formed under second layer 23.

Figure 15:
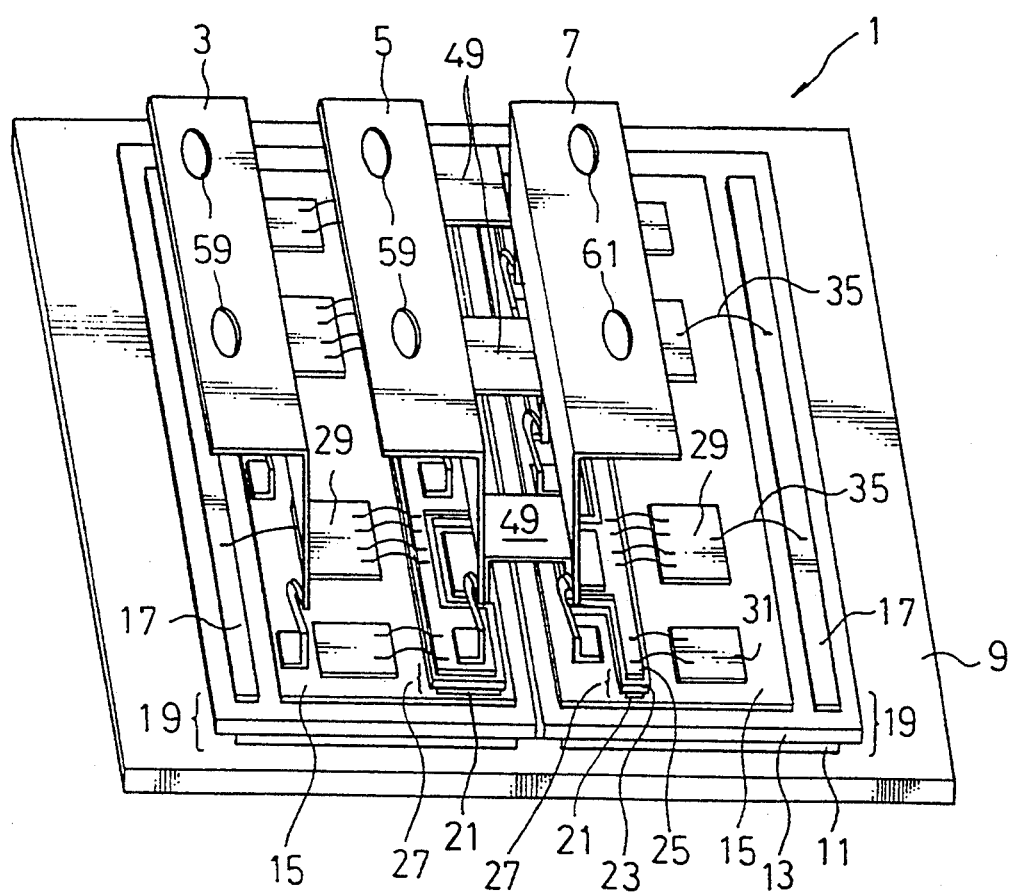
FIG. 15 is a view showing the internal structure of a semiconductor device according to another embodiment of the present invention.

In the embodiment shown in FIG. 15, a packaging substrate 27 (second DBC substrate 23) is comprised of fifth Cu layer 21, second insulating ceramic plate 23 made from $Al_2O_3$, AlN, etc. and sixth Cu layer 25, those of which are layered by the DBC method. And, this substrate 27, which has a plurality of (in this embodiment, three) wide parts and narrow parts arranged in a line alternatively, is soldered to third Cu layer 15.

Figure 9:
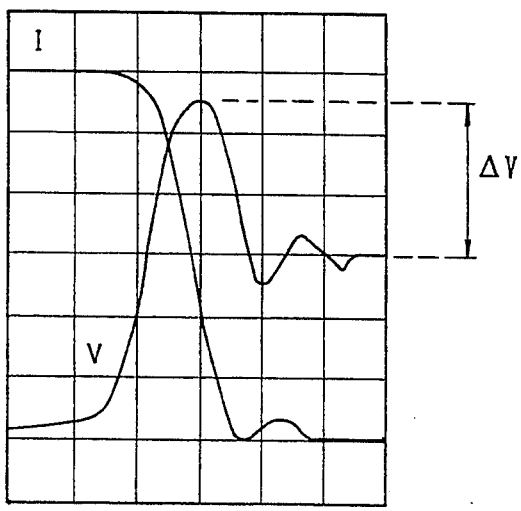
FIG. 9a is a graph showing the wave-form characteristic of a surge voltage obtained at a turn-off switching of the semiconductor device according to one prior art of this invention.
FIG. 9b is a graph showing the wave-form characteristic of a surge voltage obtained at a turn-off switching of the semiconductor device according to this invention.
Figure 9:
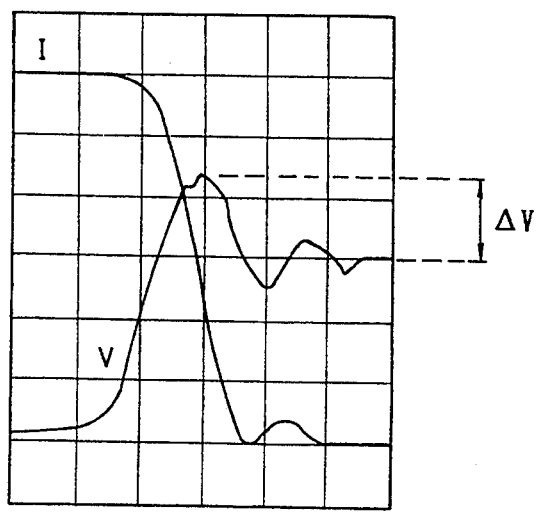
Figure 10:
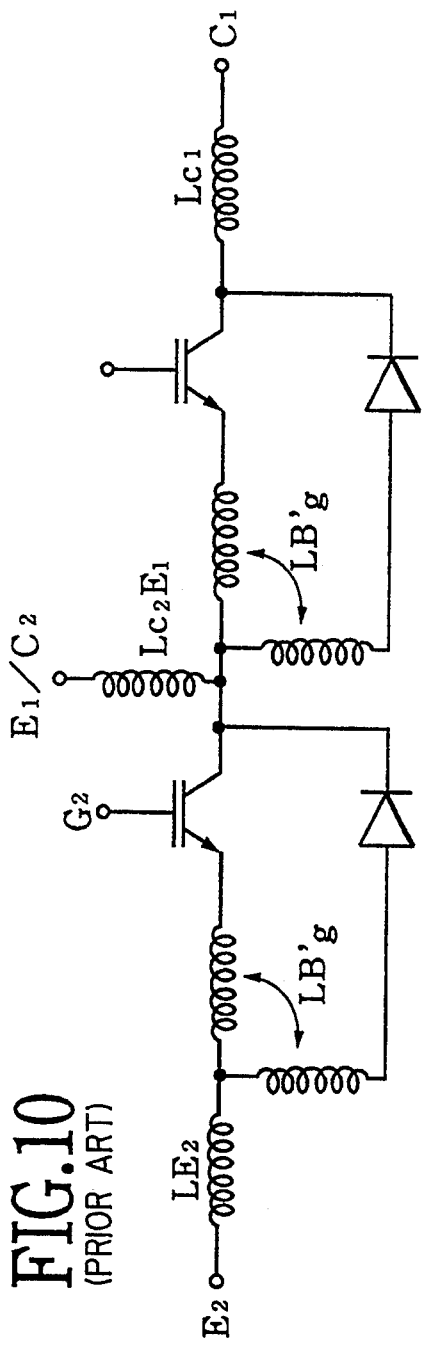
FIG. 10 is a view showing the equivalent circuit of the semiconductor device according to the prior art of this invention.
Figure 11:
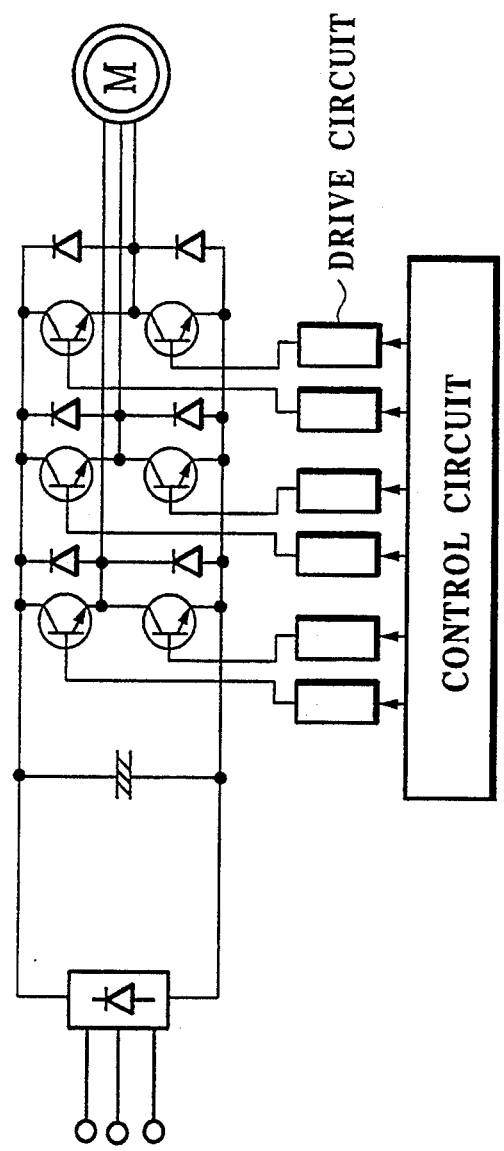
FIG. 11 is a view showing the structure of a three phase motor driving circuit in which the semiconductor device of this invention is applied.
Figure 12:
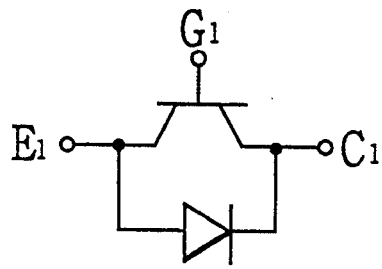
FIGS. 12a and 12b are views showing the equivalent circuits of the semiconductor devices according to the prior art of this invention.
Figure 12:
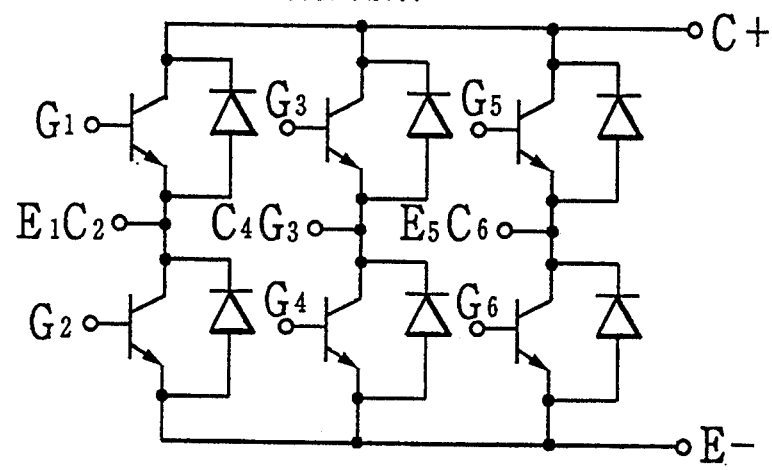
Figure 13:
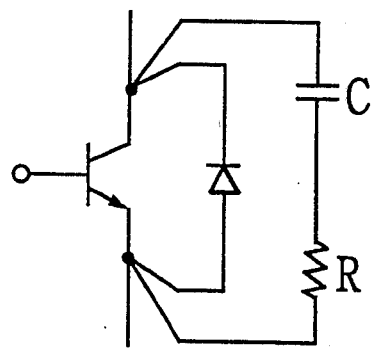
FIGS. 13a and 13b are views showing snubber circuits for reducing the surge voltage generated in a semiconductor device.
Figure 13:
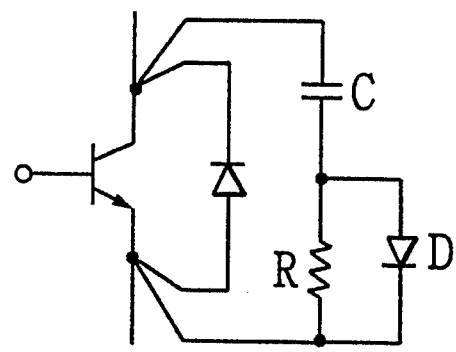
Figure 14:
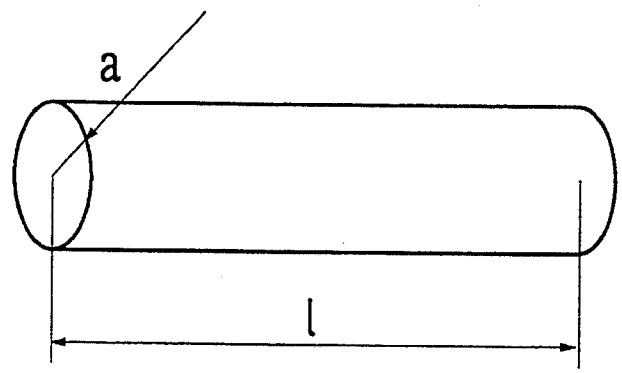
FIGS. 14a and 14b are views for explaining the inductance induced in a usual conductor.
Figure 14:
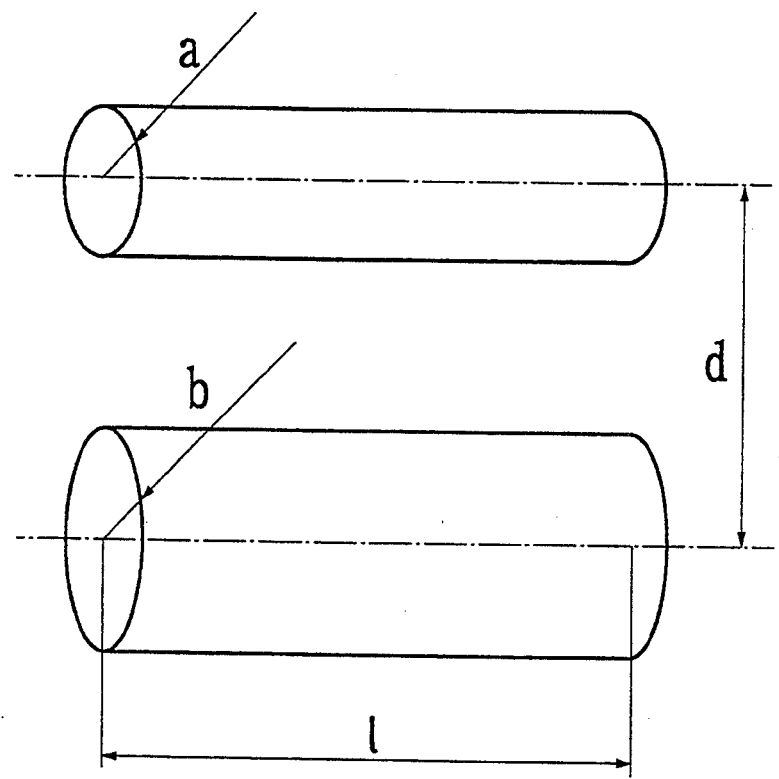

In summary, according to the present invention, the internal inductance of a semiconductor device is efficiently reduced. In FIG. 9a, the wave-form characteristic of surge voltage at a turn-off switching is shown of the prior art semiconductor device. As well, FIG. 9b shows the wave-form characteristic of surge voltage at a turn-off switching obtained from the device of this invention.

As shown in these figures, the surge voltage $\Delta V$ obtained from the device of this invention is reduced by 50% of the value obtained from the prior art device. So, the semiconductor device of this invention can accomplish high speed switchings with a large current (that is, with large di/dt), without being destroyed and without inducing wrong operations and the destruction of external circuits.

What is claimed is:

1. A semiconductor device, comprising:
   a radiation plate;
   a first conductor fixed on said radiation plate;
   a first insulating layer fixed on said first conductor;
   a second conductor fixed on said first insulating layer;
   at least one semiconductor element and a second insulating layer fixed on said second conductor;
   a third conductor fixed on said second insulating layer;
   a fourth conductor for electrically connecting the surface electrode of said semiconductor element with said third conductor;
   a first power terminal fixed on said second conductor; and
   a second power terminal fixed on said third conductor.

2. The semiconductor device as claimed in claim 1, wherein said second insulating layer has areas existing between said semiconductor element and said first power terminal.

3. The semiconductor device as claimed in claim 1, wherein said device is so structured that the main current on said second conductor flows in the opposite direction of the main current on said fourth conductor.

4. A semiconductor device, comprising:
   a radiation plate;
   a plurality of packaging substrates fixed on said radiation plate;
   each of said packaging substrates having a first conductor, a first insulating layer fixed on said first conductor, a second conductor fixed on said first insulating layer, a second insulating layer fixed on said second conductor, and a third conductor fixed on said second insulating layer;
   at least one semiconductor element fixed on said second conductor contained in said at least one packaging substrate; and
   fourth conductors for electrically connecting said plurality of packaging substrates with each other at a plurality of points.

5. The semiconductor device as claimed in claim 4, wherein said packaging substrates are fixed on said radiation plate in such a way of facing each other in point symmetry.

6. The semiconductor device as claimed in claim 4, wherein said packaging substrates have the same structure.

7. A semiconductor device, comprising:
a first conductor;
a first insulating layer fixed on said first conductor;
a second conductor fixed on said first insulating layer;
at least one semiconductor element fixed on said second conductor;
a first power terminal electrically connected with the front surface electrode of said semiconductor element; and
a second power terminal electrically connected with the back surface electrode of said semiconductor element;
wherein either one of said first or second power terminal has a flat part in which the width is larger than the height in magnitude.

8. The semiconductor device as claimed in claim 7, wherein said flat part of said power terminal has a plurality of bumpers.

9. The semiconductor device as claimed in claim 7, wherein said flat part of said power terminal has a plurality of bumpers arranged in a row.

10. The semiconductor device as claimed in claim 9, wherein the width of said flat part is wider than the distance between said bumpers which exist at the both ends of this flat part.

11. The semiconductor device as claimed in claim 7, wherein each of said first and second power terminals has said flat part, and these parts are arranged substantially parallel to each other.

12. The semiconductor device as claimed in claim 11, wherein the distance between said flat parts of said first and second power terminals is less than 1/5 of the flat part width of either one of said first or second terminal whose width is smaller than that of the other.

13. The semiconductor device as claimed in claim 11, wherein each flat part of said first and second power terminals has bumpers, and these bumpers are arranged substantially parallel with each other.

14. The semiconductor device as claimed in claim 7, wherein either one of said first or second power terminal has a plurality of holes for connecting external wires.

15. The semiconductor device as claimed in claim 7, wherein said device is so constructed that the main current on said first power terminal flows in the opposite direction of the main current on said second power terminal.

* * * * *